(12) United States Patent
Sato

(10) Patent No.: US 11,257,515 B1
(45) Date of Patent: Feb. 22, 2022

(54) DISK DEVICE

(71) Applicants: Kabushiki Kaisha Toshiba, Tokyo (JP); Toshiba Electronic Devices & Storage Corporation, Tokyo (JP)

(72) Inventor: Yuki Sato, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/198,481

(22) Filed: Mar. 11, 2021

(30) Foreign Application Priority Data

Sep. 17, 2020 (JP) .............................. JP2020-156775

(51) Int. Cl.
*G11B 5/09* (2006.01)
*G11B 5/187* (2006.01)
*G11B 20/10* (2006.01)
*H05K 1/18* (2006.01)

(52) U.S. Cl.
CPC ........ *G11B 5/187* (2013.01); *G11B 20/10009* (2013.01); *H05K 1/181* (2013.01); *H05K 1/189* (2013.01)

(58) Field of Classification Search
None
See application file for complete search history.

(56) References Cited

U.S. PATENT DOCUMENTS

| 5,920,444 A | * | 7/1999 | Heeren | G11B 5/4833 360/245.2 |
| 6,351,351 B1 | * | 2/2002 | Takasugi | G11B 5/486 360/245.9 |
| 6,502,300 B1 | * | 1/2003 | Casey | G11B 5/4813 29/593 |
| 6,587,353 B2 | | 7/2003 | Sumikawa et al. | |
| 7,863,525 B2 | | 1/2011 | Miyagawa | |
| 2003/0086204 A1 | * | 5/2003 | Lindrose | G11B 33/14 360/128 |
| 2006/0012920 A1 | * | 1/2006 | Kobae | H05K 3/363 360/245.9 |
| 2006/0285247 A1 | * | 12/2006 | Tamaoka | H02K 3/522 360/99.08 |

(Continued)

FOREIGN PATENT DOCUMENTS

JP 2020-47341 A 3/2020

*Primary Examiner* — Peter Vincent Agustin
(74) *Attorney, Agent, or Firm* — Allen & Overy LLP

(57) ABSTRACT

According to one embodiment, a disk device includes a recording medium, a first magnetic head, a first wiring member, a flexible printed circuit board, and a wire. The first wiring member is electrically connected to the first magnetic head. The flexible printed circuit board includes a surface, a first fixed part fixed to a first component, and a second fixed part fixed to a second component, and is electrically connected to the first magnetic head through the first wiring member. The wire on the flexible printed circuit board extends along the surface such that the wire extends between the first fixed part and the second fixed part in a direction intersecting at an angle of larger than 45 degrees and not larger than 90 degrees with an extending direction of a virtual shortest line that connects the first fixed part to the second fixed part along the surface.

7 Claims, 4 Drawing Sheets

(56) References Cited

U.S. PATENT DOCUMENTS

| | | | |
|---|---|---|---|
| 2008/0209457 A1* | 8/2008 | Narui | G11B 33/122 |
| | | | 720/658 |
| 2008/0273262 A1* | 11/2008 | Kurita | G11B 33/121 |
| | | | 360/97.13 |
| 2009/0025970 A1 | 1/2009 | Yanagisawa | |
| 2009/0214897 A1* | 8/2009 | Sato | G11B 5/82 |
| | | | 428/848.3 |
| 2013/0248233 A1* | 9/2013 | Kan | G11B 5/4873 |
| | | | 174/260 |
| 2014/0047462 A1* | 2/2014 | Han | G11B 17/056 |
| | | | 720/601 |
| 2020/0090688 A1 | 3/2020 | Tokuda et al. | |

* cited by examiner

US 11,257,515 B1

DISK DEVICE

CROSS-REFERENCE TO RELATED APPLICATIONS

This application is based upon and claims the benefit of priority from Japanese Patent Application No. 2020-156775, filed on Sep. 17, 2020 the entire contents of which are incorporated herein by reference.

FIELD

Embodiments described herein relate generally to a disk device.

BACKGROUND

A disk device, such as a hard disk drive (HDD), includes a magnetic disk and a magnetic head for reading/writing information to/from the magnetic disk. The control circuit for controlling the HDD is electrically connected to the magnetic head through, for example, a printed circuit board (PCB), a flexible printed circuit board (FPC), and a flexure.

The FPC can be fixed to various components, such as a rotary actuator for moving the magnetic head, and electronic components mounted on the FPC. Because of this, the FPC may be subjected to thermal stress due to thermal contraction and/or thermal expansion of its own.

DETAILED DESCRIPTION

In general, according to one embodiment, a disk device includes a recording medium of a disk shape, a first magnetic head, a first wiring member, a flexible printed circuit board, and a wire. The recording medium includes a recording layer. The first magnetic head is configured to read and write information from and to the recording medium. The first wiring member is electrically connected to the first magnetic head. The flexible printed circuit board includes a surface, a first fixed part fixed to a first component, and a second fixed part fixed to a second component, and is electrically connected to the first magnetic head through the first wiring member. The wire is installed on the flexible printed circuit board, and extends along the surface, the wire extending between the first fixed part and the second fixed part in a direction intersecting at an angle of larger than 45 degrees and not larger than 90 degrees with an extending direction of a virtual line that connects a shortest distance between the first fixed part and the second fixed part along the surface.

Hereinafter, an embodiment will be explained with reference to FIGS. 1 to 4. It should be noted that, in the present specification, there is a case where a plurality of expressions are used, with reference to a constituent element according to an embodiment and description on the element. The constituent elements and description thereof are mere examples, and are not limited to the expressions given in the present specification. A constituent element may be identified with a name different from that in the present specification. Further, a constituent element may be described by using an expression different from that in the present specification.

Figure 1:
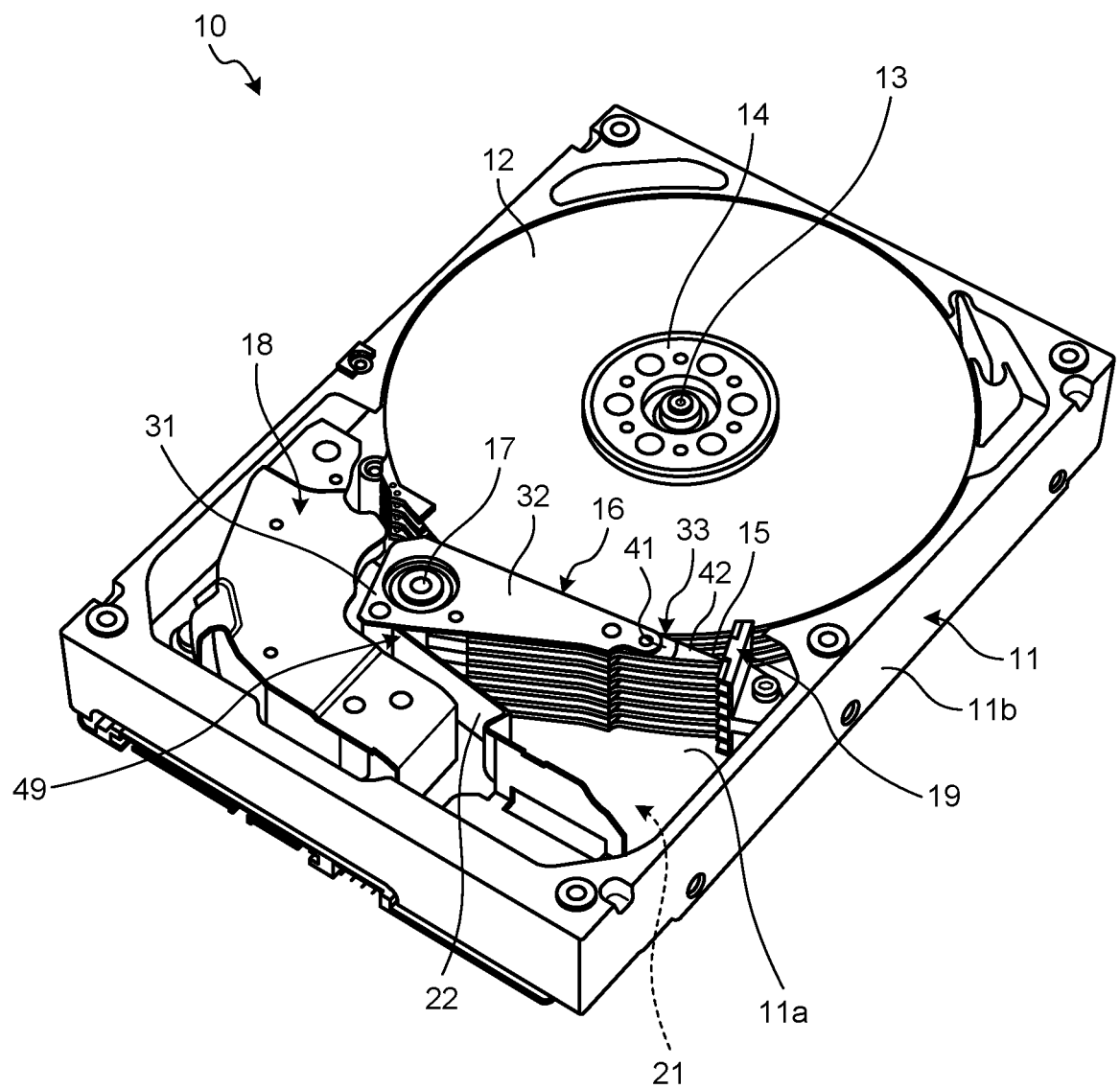
FIG. 1 is an exemplary perspective view schematically illustrating a hard disk drive (HDD) according to an embodiment.

FIG. 1 is an exemplary perspective view schematically illustrating a hard disk drive (HDD) 10 according to an embodiment. The HDD 10 is an example of a disk device. The disk device is not limited to the HDD 10 and may be another disk device, such as a hybrid hard disk drive.

As illustrated in FIG. 1, the HDD 10 includes a housing 11, a plurality of magnetic disks 12, a spindle motor 13, a clamp spring 14, a plurality of magnetic heads 15, an actuator assembly 16, a support shaft 17, a voice coil motor (VCM) 18, a ramp load mechanism 19, a printed circuit board (PCB) 21, and a flexible printed circuit board (FPC) 22. The magnetic disks 12 represent an example of a recording medium. The plurality of magnetic heads 15 represents an example of a first magnetic head and a second magnetic head.

The housing 11 includes a bottom wall 11a of a plate shape and lateral walls 11b projecting from the bottom wall 11a. The housing 11 further includes a cover that is attached to the lateral walls 11b and covers the inside of the housing 11. The magnetic disks 12, the spindle motor 13, the clamp spring 14, the magnetic heads 15, the actuator assembly 16, the support shaft 17, the VCM 18, the ramp load mechanism 19, and the FPC 22 are at least partially housed in the housing 11.

For example, each of the magnetic disks 12 includes a magnetic recording layer on at least one of the upper face and the lower face. The diameter of each magnetic disk 12 is, for example, 3.5 inches but is not limited to this example.

The spindle motor 13 supports and rotates the magnetic disks 12 stacked on each other at intervals. The clamp spring 14 holds the magnetic disks 12 on the hub of the spindle motor 13.

The magnetic heads 15 record and reproduce information to and from the respective recording layers of the magnetic disks 12. In other words, the magnetic heads 15 read/write information from/to the magnetic disks 12. The magnetic heads 15 are supported by the actuator assembly 16.

The support shaft 17 is positioned away from the magnetic disks 12, and rotatably supports the actuator assembly 16e. The VCM 18 rotates the actuator assembly 16 to place the assembly 16 at a desired position. After the magnetic heads 15 move to the outermost circumference of the magnetic disks 12 due to the rotation of the actuator assembly 16 by the VCM 18, the ramp load mechanism 19 holds the magnetic heads 15 at an unload position away from the magnetic disks 12.

The actuator assembly 16 includes an actuator block 31, a plurality of arms 32, and a plurality of head suspension assemblies 33. Each of the head suspension assemblies 33 may also be referred to as "head gimbal assembly (HGA)".

The actuator block 31 is rotatably supported by the support shaft 17 via a bearing, for example. The plurality of arms 32 projects from the actuator block 31 in a direction substantially orthogonal to the support shaft 17. The actuator assembly 16 may be divided such that the arms 32 project from the corresponding actuator blocks 31.

The arms 32 are arranged at intervals in the extending direction of the support shaft 17. Each of the arms 32 has a plate shape that is insertable into the adjacent magnetic disks 12. The arms 32 extend substantially in parallel to each other.

The actuator block 31 and the arms 32 are integrally formed from aluminum, for example. The material of the actuator block 31 and the arms 32 is not limited to this example.

The actuator block 31 has a protrusion projecting in the direction opposite to the arms 32, and the voice coil of the VCM 18 is set on the protrusion. The VCM 18 includes a pair of yokes, the voice coil placed between the yokes, and magnets included in the yokes.

The head suspension assemblies 33 are attached to the tips of the corresponding arms 32 and project from the arms 32. Thus, the head suspension assemblies 33 are arranged at intervals in the extending direction of the support shaft 17.

Figure 2:
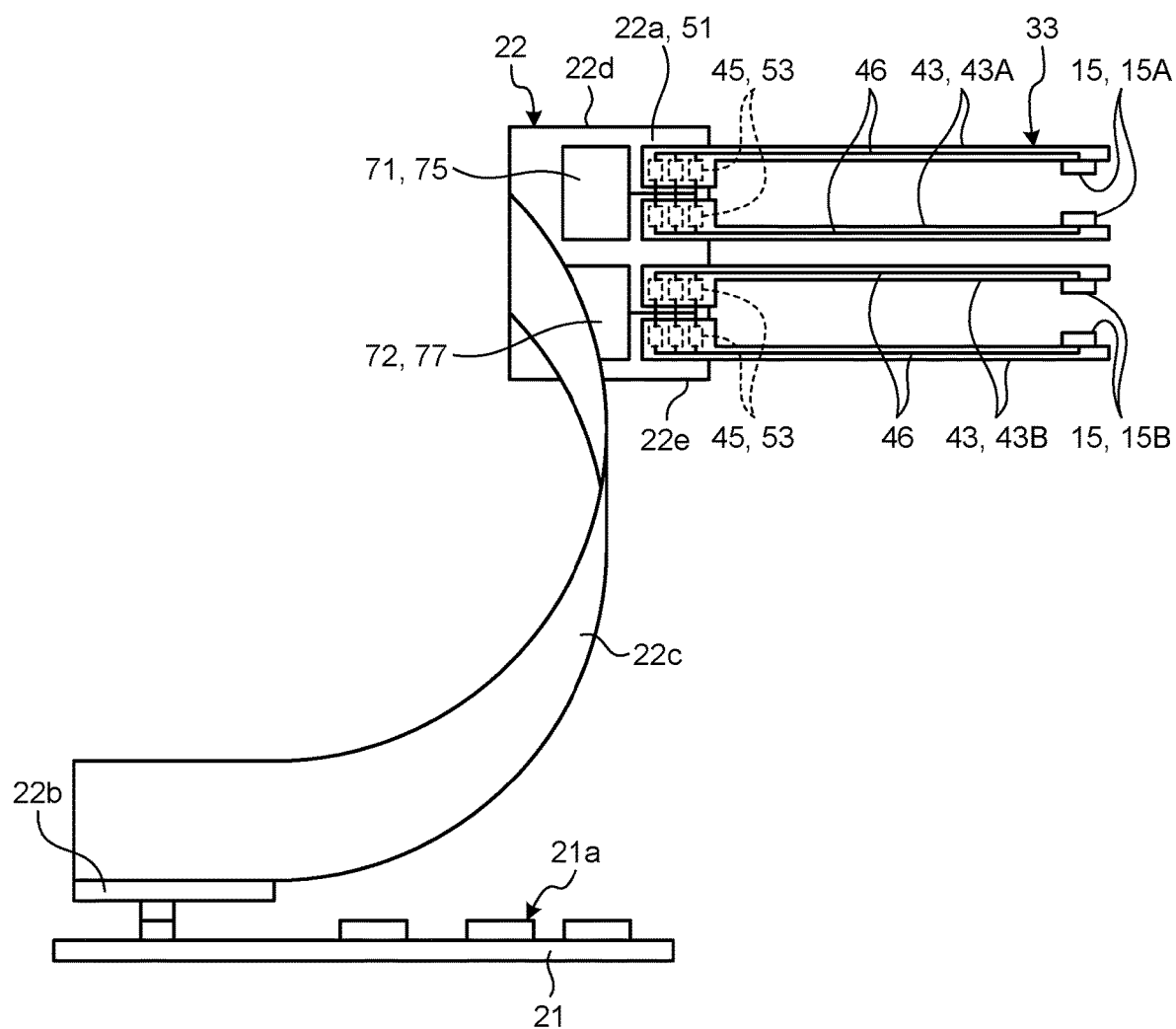
FIG. 2 is an exemplary diagram schematically illustrating a flexible printed circuit board (FPC) and flexures in the embodiment.

FIG. 2 is an exemplary diagram schematically illustrating the FPC 22 and flexures 43 in this embodiment. Each of the head suspension assemblies 33 includes a base plate 41 and a load beam 42 that are illustrated in FIG. 1, and a flexure 43 illustrated in FIG. 2. The flexures 43 represent an example of a first wiring member and a second wiring member. Further, the magnetic heads 15 are attached to the head suspension assemblies 33.

The base plate 41 and the load beam 42 are made of stainless steel, for example. The material of the base plate 41 and the load beam 42 is not limited to this example. The base plate 41 is attached to the distal end of each arm 32. The load beam 42 has a plate shape thinner than the base plate 41. The load beam 42 is attached to the distal end of the base plate 41, projecting from the base plate 41.

As illustrated in FIG. 2, the flexures 43 have an elongated strip shape. The shape of the flexures 43 is not limited to this example. Each flexure 43 is a laminated sheet including a metal plate (lining layer) such as stainless steel, an insulating layer formed on the metal plate, a conductive layer formed on the insulating layer and constituting a plurality of wires (wiring pattern), and a protective layer (insulating layer) covering the conductive layer.

Each flexure 43 is attached to the base plate 41 and the load beam 42. The flexure 43 includes, at one end, a gimbal (elastic support) that is located on the load beam 42 and displaceable. Each magnetic head 15 is mounted on the gimbal. Thereby, the flexure 43 is electrically connected to the magnetic head 15.

Each flexure 43 includes, at the other end, a plurality of pads 45. Further, the flexure 43 is provided with a plurality of wires 46 that connects the plurality of pads 45 to a read element, a write element, a heater, and other components of the magnetic head 15.

As illustrated in FIG. 1, the VCM 18, the actuator block 31, and the plurality of arms 32 as described above form a rotary actuator 49 that moves the magnetic heads 15 to a desired position. The rotary actuator 49 is not limited to this example. For example, the rotary actuator 49 may omit at least one of the VCM 18, the actuator block 31, and the arms 32 or may include another component. The rotary actuator 49 is an example of a first component.

The rotary actuator 49 is driven by the VCM 18, for example, to rotate about the support shaft 17. The rotary actuator 49 rotates to move the head suspension assemblies 33 attached to the arms 32 and the magnetic heads 15 attached to the head suspension assemblies 33.

The PCB 21 is attached to the bottom wall 11a outside of the housing 11. As illustrated in FIG. 2, the PCB 21 is provided with a control circuit 21a that controls the spindle motor 13, the magnetic heads 15, and the VCM 18.

For example, the control circuit 21a includes a read/write channel (RWC) that controls the magnetic heads 15 to read and write information, a hard disk controller (HDC) that controls communication with the host computer, a processor that controls the HDD 10 as a whole, and a servo combo IC (SVC) that controls the spindle motor 13 and the VCM 18. The control circuit 21a is not limited to this example. The control circuit 21a is electrically connected to the magnetic heads 15 and the VCM 18 through the FPC 22.

For example, the FPC 22 includes an insulating layer such as a base film, a conductor layer formed on the insulating layer, and an insulating protective layer covering the conductor layer. For example, the FPC 22 is a double-sided FPC including a conductor layer and a protective layer on each side of the insulating layer, or is a multi-layered FPC including a lamination of conductor layers and insulating layers. The FPC 22 is not limited to this example.

The flexures 43 are connected to one end 22a of the FPC 22. The PCB 21 is electrically connected to the other end 22b of the FPC 22 through a connector placed on the bottom wall 11a of the housing 11, for example. A middle part 22c of the FPC 22 between the end 22a and the end 22b extends in a strip form and is bendable along with the rotation of the rotary actuator 49.

Figure 3:
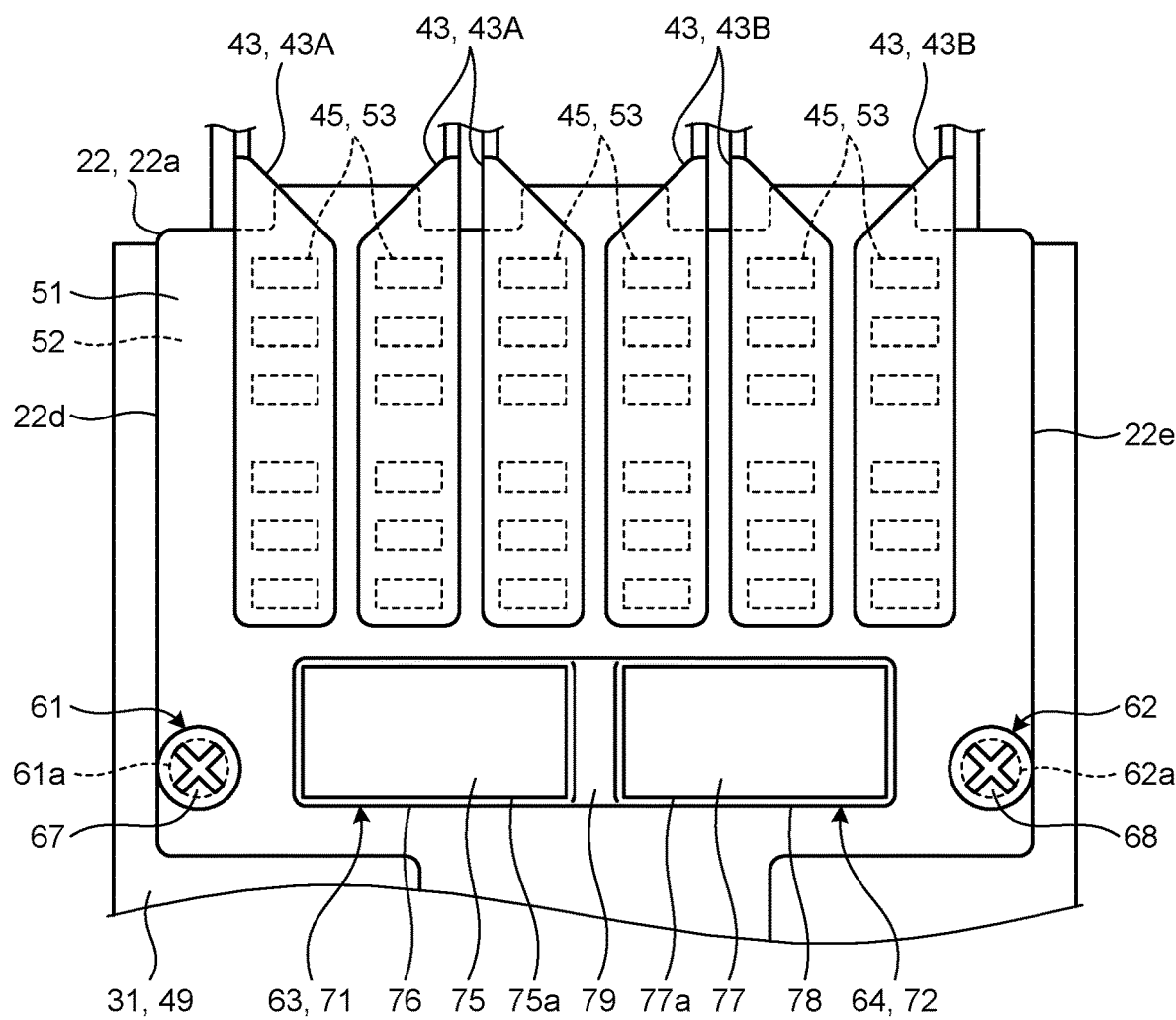
FIG. 3 is an exemplary plan view schematically illustrating an end of the FPC and the flexures in the embodiment.

FIG. 3 is an exemplary plan view schematically illustrating the end 22a of the FPC 22 and the flexures 43 in the embodiment. The FPC 22 includes a first surface 51, a second surface 52, and a plurality of pads 53. The first surface 51 is an example of a surface. For example, the first surface 51 is formed by one of the protective layers. The second surface 52 is opposite the first surface, and is formed by the other of the protective layers, for example. The second surface 52 faces the actuator block 31 of the rotary actuator 49, for example.

The pads 53 are provided on the first surface 51 at the end 22a of the FPC 22, for example. The pads 53 are connected to the pads 45 of the flexures 43 with a conductive adhesive or solder, for example. Thus, the flexures 43 are connected to the end 22a, and the FPC 22 is electrically connected to the magnetic heads 15 through the flexures 43.

The FPC 22 further includes, at the end 22a, a first attachment part 61, a second attachment part 62, a first mount 63, and a second mount 64. The first attachment part 61 is an example of a first fixed part. The second attachment part 62 is an example of a third fixed part. The first mount 63 is an example of a second fixed part. Alternatively, the first mount 63 can be an example of the first fixed part and the second mount 64 can be an example of the second fixed part.

The first attachment part 61 and the second attachment part 62 correspond to the fixed part, of the end 22a of the FPC 22, to the rotary actuator 49. The first attachment part 61 and the second attachment part 62 are arranged away from each other in a first direction D1 in FIG. 3.

The first direction D1 is a direction along the first surface 51. The direction along the first surface 51 is substantially parallel to the first surface 51. In this embodiment, the first direction D1 is substantially parallel to the extending direction of the support shaft 17.

The first attachment part 61 is located near one edge 22d of the FPC 22 in the first direction D1. In other words, the first attachment part 61 is located at one end of the FPC 22 in the first direction D1.

The second attachment part 62 is located near the other edge 22e of the FPC 22 in the first direction D1. In other words, the second attachment part 62 is located at the other end of the FPC 22 in the first direction D1.

The first attachment part 61 is provided with a hole 61a. The second attachment part 62 is provided with a hole 62a. The holes 61a and 62a penetrate the FPC 22 and open to the first surface 51 and the second surface 52.

The first attachment part 61 is fixed to the actuator block 31 of the rotary actuator 49 with a first screw 67, for example. The first screw 67 is inserted through the hole 61a into a screw hole of the actuator block 31, for example. Thereby, the first attachment part 61 is fixed to the actuator block 31 with the screw. the first attachment part 61 may be fixed to the actuator block 31 with a pin, solder, an adhesive, or other means, in place of the first screw 67.

The second attachment part 62 is fixed to the actuator block 31 with a second screw 68, for example. The second screw 68 is inserted through the hole 62a into a screw hole of the actuator block 31, for example. Thereby, the second attachment part 62 is fixed to the actuator block 31 with the screw. The second attachment part 62 may be fixed to the actuator block 31 with a pin, solder, an adhesive, or other means, in place of the second screw 68.

A first mounted component 71 and a second mounted component 72 are mounted on the FPC 22. The first mounted component 71 is an example of a second component. Alternatively, that the first mounted component 71 can be an example of the first component and the second mounted component 72 can be an example of the second component. The first mount 63 and the second mount 64 correspond to the part to which the first mounted component 71 and the second mounted component 72 are fixed, of the end 22a of the FPC 22.

The first mounted component 71 includes a first preamplifier 75 and a first underfill 76. The first mounted component 71 may include another electronic component, such as an IC or a sensor, in place of the first preamplifier 75.

The first preamplifier 75 has a substantially rectangular plate shape, and is mounted on the first surface 51 of the FPC 22. For example, the electrodes of the first preamplifier 75 are connected to the pads located on the first surface 51 with a conductive adhesive or solder. That is, the first preamplifier 75 is electrically connected to some of the magnetic heads 15 through the FPC 22 and the corresponding flexures 43.

Hereinafter, the magnetic head 15 and the flexure 43 electrically connected to the first preamplifier 75 may be referred to as "magnetic head 15A" and "flexure 43A", respectively, as shown in FIG. 2. At least one of the magnetic heads 15 serves as the magnetic head 15A, and the magnetic head 15A is an example of a first magnetic head. At least one of the flexures 43 serves as the flexure 43A, and the flexure 43A is an example of a first wiring member.

The first preamplifier 75 is electrically connected to the control circuit 21a of the PCB 21 through the FPC 22. Further, the first preamplifier 75 is electrically connected to the magnetic head 15A through the FPC 22 and the corresponding flexure 43A.

The first preamplifier 75 amplifies a write signal output from the RWC of the control circuit 21a, and transmits the signal to the magnetic head 15A. In accordance with the write signal, the magnetic head 15A writes information to the corresponding magnetic disk 12. In this way, the first preamplifier 75 outputs the write signal, which corresponds to information to be written by the magnetic head 15A to the magnetic disk 12, to the magnetic head 15A through the FPC 22 and the flexure 43A.

The first preamplifier 75 amplifies a read signal output from each magnetic head 15A, and transmits the signal to the RWC of the control circuit 21a. In other words, the first preamplifier 75 receives the read signal, which corresponds to information read by the magnetic head 15A from the corresponding magnetic disk 12, from the magnetic head 15A through the FPC 22 and the flexure 43A.

As illustrated in FIG. 3, the first underfill 76 serves to secure the first preamplifier 75 on the first surface 51 of the FPC 22. Further, the first mounted component 71 is fixed to the first mount 63 by the first underfill 76.

For example, the first underfill 76 adheres to an edge 75a of the first preamplifier 75 and also adheres to the first surface 51. Part of the first underfill 76 may lie between the first preamplifier 75 and the first surface 51.

The edge 75a is an edge of the first preamplifier 75 in a direction along the first surface 51. In this embodiment, the first underfill 76 adheres to the entire edge 75a. Thus, the first underfill 76 surrounds the first preamplifier 75.

The second mounted component 72 includes a second preamplifier 77 and a second underfill 78. The second mounted component 72 may include another electronic component, such as an IC or a sensor, in place of the second preamplifier 77.

The second preamplifier 77 has a substantially rectangular plate shape, and is mounted on the first surface 51 of the FPC 22. For example, the electrodes of the second preamplifier 77 are connected to the pads located on the first surface 51 with a conductive adhesive or solder. Thereby, the second preamplifier 77 is electrically connected to some of the magnetic heads 15 through the FPC 22 and the corresponding flexures 43.

Hereinafter, the magnetic head 15 and the flexure 43 electrically connected to the second preamplifier 77 may be referred to as "magnetic head 15B" and "flexure 43B", respectively, as shown in FIG. 2. At least one of the magnetic heads 15 serves as the magnetic head 15B, and the magnetic head 15B is an example of a second magnetic head. At least one of the flexures 43 serves as the flexure 43B, and the flexure 43B is an example of a second wiring member.

The second preamplifier 77 is electrically connected to the control circuit 21a of the PCB 21 through the FPC 22. Further, the second preamplifier 77 is electrically connected to the magnetic head 15B through the FPC 22 and the flexure 43B.

The second preamplifier 77 amplifies a write signal output from the RWC of the control circuit 21a, and transmits the signal to the magnetic head 15B. In accordance with the write signal, the magnetic head 15B writes information to the corresponding magnetic disk 12. In this way, the second preamplifier 77 outputs the write signal, which corresponds to information to be written by the magnetic head 15B to the magnetic disk 12, to the magnetic head 15B through the FPC 22 and the flexure 43B.

The second preamplifier 77 amplifies a read signal output from the magnetic head 15B, and transmits the signal to the RWC of the control circuit 21a. In other words, the second preamplifier 77 receives the read signal, which corresponds to information read by the magnetic head 15B from the corresponding magnetic disk 12, from the magnetic head 15B through the FPC 22 and the flexure 43B.

As illustrated in FIG. 3, the second underfill 78 serves to secure the second preamplifier 77 on the first surface 51 of the FPC 22. Further, the second mounted component 72 is fixed to the second mount 64 by the second underfill 78.

For example, the second underfill 78 adheres to an edge 77a of the second preamplifier 77 and also adheres to the first surface 51. Part of the second underfill 78 may lie between the second preamplifier 77 and the first surface 51.

The edge 77a is an edge of the second preamplifier 77 in a direction along the first surface 51. In this embodiment, the second underfill 78 adheres to the entire edge 77a. Thus, the second underfill 78 surrounds the second preamplifier 77.

The first underfill 76 and the second underfill 78 may be connected to each other through a third underfill 79. In this case, the first underfill 76 has a chevron cross section (fillet) which increases in thickness in the vicinity of the edge 75a of the first preamplifier 75 in a second direction D2 as approaching the edge 75a. The second underfill 78 has a fillet which increases in thickness in the vicinity of the edge 77a of the second preamplifier 77 in the second direction D2 as approaching the edge 77a.

The second direction D2 is a direction intersecting with the first surface 51. In this embodiment, the second direction D2 is a direction orthogonal to the first surface 51. That is, the second direction D2 is orthogonal to the first direction D1.

The third underfill 79 is continuous with the first underfill 76 and the second underfill 78. The third underfill 79 does not form the fillet but spreads substantially flat. In the second direction D2 the thickness of the third underfill 79 D2 is smaller than the maximum thickness of the first underfill 76 and smaller than the maximum thickness of the second underfill 78. The third underfill 79 may be omitted.

The first mount 63 and the second mount 64 are located between the first attachment part 61 and the second attachment part 62. The first attachment part 61, the second attachment part 62, the first mount 63, and the second mount 64 are juxtaposed to one another at intervals in the first direction D1. The first mount 63 is closer to the first attachment part 61 than the second mount 64 is. The arrangement of the first attachment part 61, the second attachment part 62, the first mount 63, and the second mount 64 is not limited to this example.

Figure 4:
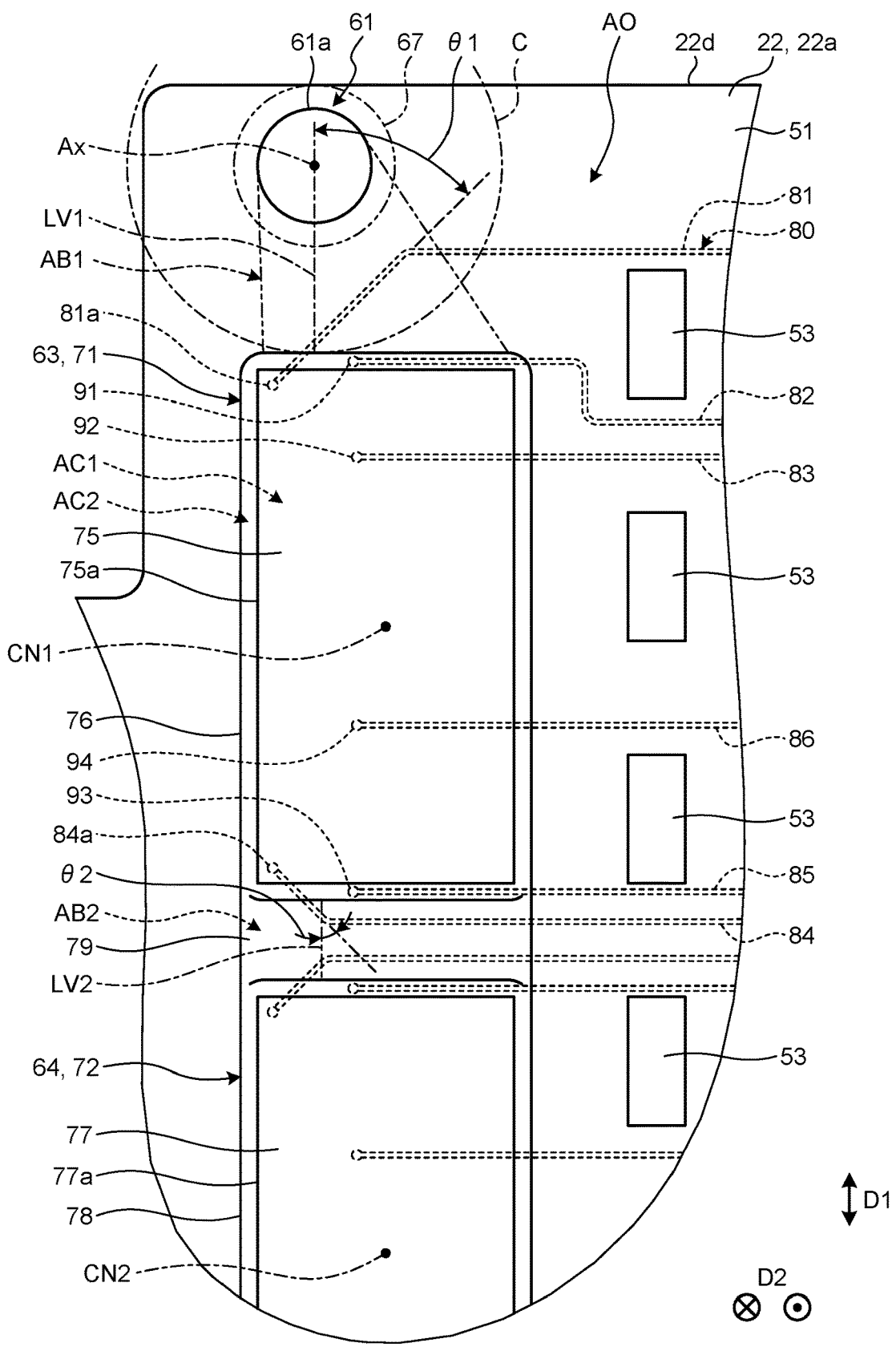
FIG. 4 is an exemplary plan view schematically illustrating part of the FPC in the embodiment.

FIG. 4 is an exemplary plan view schematically illustrating part of the FPC 22 in the embodiment. As illustrated in FIG. 4, the FPC 22 is provided with a conductor pattern 80. For example, the conductor pattern 80 is formed in the conductor layer of the FPC 22, and is covered with the protective layer.

The conductor pattern 80 is made of a conductor, such as copper. The conductor pattern 80 includes a first wire 81, a second wire 82, a third wire 83, a fourth wire 84, a fifth wire 85, a sixth wire 86, a first via hole 91, a second via hole 92, a third via hole 93, and a fourth via hole 94. Each of the first wire 81 and the fourth wire 84 is an example of a wire.

Each of the first to sixth wires 81 to 86 extends on the insulating layer of the FPC 22. That is, each of the first to sixth wires 81 to 86 extends along the first surface 51. The first to sixth wires 81 to 86 may be provided on different surfaces of the insulating layer. Each of the first to sixth wires 81 to 86 includes at least one of a linearly extending portion and a curvedly extending portion.

The first to fourth via holes 91 to 94 are plated through holes, for example. The first to fourth via holes 91 to 94 may be another type of via holes. Each of the first to fourth via holes 91 to 94 is a conductor formed on the inner surface of a hole that penetrates at least one of the insulating layers of the FPC 22, for example. The first to fourth via holes 91 to 94 serve to connect the wiring installed on one of the layers of the FPC 22 to the wiring installed on another one of the layers, for example.

The first wire 81 extends from a pad 81a connected to an electrode of the first preamplifier 75, for example. The pad 81a is placed on the first surface 51 and is covered with the first preamplifier 75 in the second direction D2. Alternatively, the first wire 81 may be connected to another pad or via hole.

In the FPC 22, the first wire 81 extends from an area AC1 covered with the first preamplifier 75 to an area AO outside the first preamplifier 75 and the first underfill 76 through an area AC2 covered with the first underfill 76. The area AO is part of the FPC 22 outside the first mounted component 71 and the second mounted component 72 in a direction along the first surface 51.

Part of the first wire 81 extends in an area AB1 between the first attachment part 61 and the first mount 63. The area AB1 is also an area between the first attachment part 61 and the first underfill 76. The area AB1 is included in the area AO.

In the area AB1, the first wire 81 extends in a direction intersecting at an angle $\theta 1$ of larger than 45 degrees and not larger than 90 degrees with the extending direction of a virtual line LV1. In other words, the angle $\theta 1$ is the angle between the extending direction of the virtual line LV1 and the extending direction of the first wire 81 in the area AB1. The extending direction of the first wire 81 includes a direction along the first wire 81 and its extended line, and the direction opposite thereto. The extending direction of the virtual line LV1 includes a direction along the virtual line LV1 and its extended line, and the direction opposite thereto.

The virtual line LV1 corresponds to the shortest distance between the first attachment part 61 and the first mount 63 along the first surface 51. The virtual line LV1 also corresponds to the shortest distance between the first attachment part 61 and the first underfill 76 along the first surface 51.

For example, the virtual line LV1 can be found as follows. First, a circle C tangent to the first underfill 76 and around the axis Ax of the hole 61a of the first attachment part 61 is drawn. When a plurality of circles can be drawn, the circle C is the smallest one of the circles. The virtual line LV1 can be obtained by connecting the contact point between the circle C and the first underfill 76 to the axis Ax. The virtual line LV1 is not limited to this example.

The first attachment part 61 and the first mount 63 serve to constrain thermal contraction and thermal expansion of the FPC 22 since they are fixed to other components. Consequently, thermal contraction and/or thermal expansion of the FPC 22, if occurs, cause thermal stress in the area AB1 between the first attachment part 61 and the first mount 63. The extending direction of the virtual line LV1 is a direction in which the thermal stress greatly acts, therefore, it can also be called "principal stress direction".

The first wire 81 may be bent in at least one location. In other words, the extending direction of the first wire 81 may vary. However, in the area AB1 the first wire 81 extends entirely in the direction intersecting at the angle $\theta 1$ of larger than 45 degrees and not larger than 90 degrees with the extending direction of the virtual line LV1.

In the example of FIG. 4, in the area AB1 the first wire 81 intersects with the virtual line LV1 at the angle $\theta 1$ of larger than 45 degrees and not larger than 90 degrees. However, the first wire 81 may not intersect with the virtual line LV1 as long as the extending direction of the virtual line LV1 and the extending direction of the first wire 81 in the area AB1 intersect with each other at the angle $\theta 1$.

For example, when the pad 81a is placed closer to the pad 53 than to the first attachment part 61, the first wire 81 does not intersect with the virtual line LV1. However, the extending direction of the virtual line LV1 and the extending direction of the first wire 81 in the area AB1 intersect with each other at the angle $\theta 1$, so that the extended line of the first wire 81 intersects with the extended line of the virtual line LV1 at the angle $\theta 1$ in a plan view of the first surface 51, as illustrated in FIG. 4.

The second wire 82 extends from the first via hole 91. The second wire 82 is not limited to this example and may be connected to another pad or via hole. Further, the first via hole 91 may be connected to another wire.

For example, the second wire 82 serves as one of differential wires. The other of the differential wires extends in an overlapping manner with the second wire 82 in the second direction D2, for example. The second wire 82 is not limited to this example.

The first via hole 91 is located between the first attachment part 61 and the first preamplifier 75 in the extending direction of the virtual line LV1. The first via hole 91 is covered with the first underfill 76 in the second direction D2. In other words, the first via hole 91 is located in the area AC2 of the FPC 22.

Between the first attachment part 61 and the first preamplifier 75, the second wire 82 is covered with the first underfill 76 in the second direction D2. Of the second wire 82, the part not extending between the first attachment part 61 and the first preamplifier 75 may not be covered with the first underfill 76.

For example, the second wire 82 extends along the first underfill 76 between the first attachment part 61 and the first preamplifier 75. In other words, the second wire 82 extends along the edge 75a of the first preamplifier 75 between the first attachment part 61 and the first preamplifier 75.

The third wire 83 extends from the second via hole 92. The third wire 83 is not limited to this example and may be connected to another pad or via hole. Further, the second via hole 92 may be connected to another wire.

For example, the third wire 83 serves as one of differential wires. The other of the differential wires extends in an overlapping manner with the third wire 83 in the second direction D2, for example. The third wire 83 is not limited to this example.

The second via hole 92 is located between the first attachment part 61 and the geometric center CN1 of the first preamplifier 75 in the extending direction of the virtual line LV1. The second via hole 92 is covered with the first preamplifier 75 in the second direction D2. In other words, the second via hole 92 is located in the area AC1 of the FPC 22.

Between the first attachment part 61 and the geometric center CN1 of the first preamplifier 75, the third wire 83 is covered with the first preamplifier 75 in the second direction D2. Of the third wire 83, the part not extending between the first attachment part 61 and the geometric center CN1 of the first preamplifier 75 may not be covered with the first preamplifier 75.

The fourth wire 84 extends from a pad 84a connected to an electrode of the first preamplifier 75, for example. The pad 84a is provided on the first surface 51 and is covered with the first preamplifier 75 in the second direction D2. The fourth wire 84 is not limited to this example and may be connected to another pad or via hole.

In the FPC 22, the fourth wire 84 extends from the area AC1 to the area AO through the area AC2. In the area AO, part of the fourth wire 84 extends in an area AB2 between the first mount 63 and the second mount 64. The area AB2 is also an area between the first underfill 76 and the second underfill 78. The area AB2 is included in the area AO. The area AB2 may be covered with the third underfill 79 in the second direction D2.

When the first underfill 76 and the second underfill 78 are connected to each other through the third underfill 79, the boundaries of the first underfill 76 and the second underfill 78 can be determined from the fillet described above, for example. As described above, in the fillet, the thickness of the first underfill 76 in the second direction D2 increases as approaching the edge 75a of the first preamplifier 75. That is, the boundary of the first underfill 76 is defined as the position where the thickness of the first underfill 76 starts to become substantially constant after decreasing as being further away from the edge 75a. Similarly, the boundary of the second underfill 78 is defined as the position where the thickness of the second underfill 78 starts to become substantially constant after decreasing as being further away from the edge 77a.

In the area AB2, the fourth wire 84 extends in a direction intersecting at an angle $\theta 2$ of larger than 45 degrees and not larger than 90 degrees with the extending direction of a virtual line LV2. In other words, the angle $\theta 2$ is the angle between the extending direction of the virtual line LV2 and the extending direction of the fourth wire 84 in the area AB2. The extending direction of the fourth wire 84 includes a direction along the fourth wire 84 and its extended line, and the direction opposite thereto. The extending direction of the virtual line LV2 includes a direction along the virtual line LV2 and its extended line, and the direction opposite thereto.

The virtual line LV2 is a virtual line that connects the shortest distance between the first mount 63 and the second mount 64 along the first surface 51. Further, the virtual line LV2 also connects the shortest distance between the first underfill 76 and the second underfill 78 along the first surface 51.

The first mount 63 and the second mount 64 serve to constrain thermal contraction and thermal expansion of the FPC 22 since they are fixed to other components. Due to the thermal contraction and/or thermal expansion of the FPC 22, thermal stress occurs in the area AB2 between the first mount 63 and the second mount 64. The thermal stress acts greatly in the extending direction of the virtual line LV2, therefore, the extending direction of the virtual line LV2 may also be called "principal stress direction".

The fourth wire 84 may be bent in at least one location. In other words, the extending direction of the fourth wire 84 may vary. However, in the area AB2 the fourth wire 84 extends entirely in the direction intersecting at the angle $\theta 2$ of larger than 45 degrees and not larger than 90 degrees with the extending direction of the virtual line LV2.

In the example of FIG. 4, in the area AB2 the fourth wire 84 intersects with the virtual line LV2 at the angle $\theta 2$ of larger than 45 degrees and not larger than 90 degrees. However, the fourth wire 84 may not intersect with the virtual line LV2 as long as the extending direction of the virtual line LV2 and the extending direction of the fourth wire 84 intersect with each other at the angle $\theta 2$ in the area AB2.

For example, if the pad 84a is located closer to the pad 53 than in the example of FIG. 4, the fourth wire 84 does not intersect with the virtual line LV2 of the example of FIG. 4. However, the extending direction of the virtual line LV2 and the extending direction of the fourth wire 84 in the area AB2 intersect with each other at the angle $\theta 2$, so that the extended line of the fourth wire 84 intersects with the extended line of the virtual line LV2 at the angle $\theta 2$ in a plan view of the first surface 51, as illustrated in FIG. 4.

The fifth wire 85 extends from the third via hole 93. The fifth wire 85 is not limited to this example and may be connected to another pad or via hole. Further, the third via hole 93 may be connected to another wire.

For example, the fifth wire 85 serves as one of differential wires. The other of the differential wires extends in an overlapping manner with the fifth wire 85 in the second direction D2, for example. The fifth wire 85 is not limited to this example.

The third via hole 93 is located between the first preamplifier 75 and the second preamplifier 77 in the extending direction of the virtual line LV2. The third via hole 93 is covered with the first underfill 76 in the second direction D2. In other words, the third via hole 93 is located in the area AC2 of the FPC 22. The third via hole 93 may be covered with the second underfill 78.

Between the first preamplifier 75 and the second preamplifier 77, the fifth wire 85 is covered with the first underfill 76 in the second direction D2. The fifth wire 85 may be covered with the second underfill 78. Of the fifth wire 85, the part not extending between the first preamplifier 75 and the second preamplifier 77 may not be covered with either of the first underfill 76 and the second underfill 78.

The sixth wire 86 extends from the fourth via hole 94. The sixth wire 86 is not limited to this example and may be connected to another pad or via hole. Further, the fourth via hole 94 may be connected to another wire.

For example, the sixth wire 86 serves as one of differential wires. The other of the differential wires extends in an overlapping manner with the sixth wire 86 in the second direction D2, for example. The sixth wire 86 is not limited to this example.

The fourth via hole 94 is located between the geometric center CN1 of the first preamplifier 75 and the geometric center CN2 of the second preamplifier 77 in the extending direction of the virtual line LV2. The fourth via hole 94 is covered with the first preamplifier 75 in the second direction D2. In other words, the fourth via hole 94 is located in the area AC1 of the FPC 22. The fourth via hole 94 may be covered with the second preamplifier 77.

Between the geometric center CN1 of the first preamplifier 75 and the geometric center CN2 of the second preamplifier 77, the sixth wire 86 is covered with the first preamplifier 75 in the second direction D2. The sixth wire 86 may be covered with the second preamplifier 77. Of the sixth wire 86, the part not extending between the geometric center CN1 of the first preamplifier 75 and the geometric center CN2 of the second preamplifier 77 may not be covered with either of the first preamplifier 75 and the second preamplifier 77.

The width of each of the first to sixth wires 81 to 86 is set to 35 μm or less, for example. The width of the first to sixth wires 81 to 86 installed on one side of the insulating layer of the FPC 22 is set to 30 μm, for example. In this case, the distance between the adjacent wires is set to 30 μm or more. The width of the first to sixth wires 81 to 86 installed on the other side of the insulating layer of the FPC 22 is set to 35 μm, for example. In this case, the distance between the adjacent wires is set to 35 μm or more.

The first wire 81 may be larger in width than 35 μm outside the area AB1 between the first attachment part 61 and the first mount 63. The fourth wire 84 may be larger in width than 35 μm outside the area AB2 between the first mount 63 and the second mount 64. The width of the first to sixth wires 81 to 86 is not limited to the above examples and may be set to larger than 35 μm.

In the HDD 10 according to the embodiment described above, the FPC 22 includes the first surface 51, the first attachment part 61 fixed to the rotary actuator 49, and the first mount 63 fixed to the first mounted component 71. The first wire 81 is installed on the FPC 22, extending along the first surface 51. In the area AB1 between the first attachment part 61 and the first mount 63, the first wire 81 extends in the direction intersecting at the angle θ1 of larger than 45 degrees and not larger than 90 degrees with the extending direction of the virtual line LV1 that connects the shortest distance between the first attachment part 61 and the first mount 63 along the first surface 51. The thermal contraction and/or thermal expansion of the FPC 22, if it occurs, cause thermal stress in the extending direction of the virtual line LV1 in the area AB1 between the first attachment part 61 and the first mount 63. In this embodiment, the first wire 81 extends in the direction intersecting at the angle θ1 of larger than 45 degrees and not larger than 90 degrees with the extending direction of the virtual line LV1. This setting increases the cross-sectional area of the first wire 81 orthogonal to the extending direction of the virtual line LV1 in comparison with the first wire 81 extending in parallel to the virtual line LV1. Consequently, the HDD 10 according to this embodiment can be improved in terms of the durability of the first wire 81 against thermal stress. For example, the HDD 10 can avoid the first wire 81 from being damaged due to thermal stress, resulting in reducing occurrence of a malfunction of the HDD 10.

The first attachment part 61 of the FPC 22 is fixed to the rotary actuator 49. The first mounted component 71 includes the first preamplifier 75 and the first underfill 76 that fixes the first preamplifier 75 to the FPC 22. That is, the first mount 63 of the FPC 22 is fixed to the first preamplifier 75 by the first underfill 76. The first preamplifier 75 generates heat during the operation of the HDD 10. The heat is likely to cause thermal stress along the virtual line LV1 in the vicinity of the first mount of the FPC 22. However, in this embodiment, the first wire 81 extends in the direction intersecting at the angle θ1 of larger than 45 degrees and not larger than 90 degrees with the extending direction of the virtual line LV1. Consequently, the HDD 10 according to this embodiment can be improved in terms of the durability of the first wire 81 against thermal stress.

The FPC 22 includes the second attachment part 62 fixed to the rotary actuator 49. Thus, the FPC 22 is fixed to the rotary actuator 49 in at least two locations. The first mount 63 is located between the first attachment part 61 and the second attachment part 62. This allows, for example, the first wire 81 connected to the first preamplifier 75 to be placed in the area AB1 between the first attachment part 61 and the first mount 63. Moreover, the first wire 81 extends in the direction intersecting at the angle θ1 of larger than 45 degrees and not larger than 90 degrees with the extending direction of the virtual line LV1, thereby improving in durability against thermal stress.

The FPC 22 includes the first surface 51, the first mount 63 fixed to the first mounted component 71, and the second mount 64 fixed to the second mounted component 72. The fourth wire 84 is installed on the FPC 22, extending along the first surface 51. In the area AB2 between the first mount 63 and the second mount 64, the fourth wire 84 extends in the direction intersecting at the angle θ2 of larger than 45 degrees and not larger than 90 degrees with the extending direction of the virtual line LV2 that connects the shortest distance between the first mount 63 and the second mount 64 along the first surface 51. The thermal contraction and/or thermal expansion of the FPC 22, if it occurs, cause thermal stress in the extending direction of the virtual line LV2 in the area AB2 between the first mount 63 and the second mount 64. In this embodiment, the fourth wire 84 extends in the direction intersecting at the angle θ2 of larger than 45 degrees and not larger than 90 degrees with the extending direction of the virtual line LV2. This setting increases the cross-sectional area of the fourth wire 84 orthogonal to the extending direction of the virtual line LV2 as compared with the fourth wire 84 extending in parallel to the virtual line LV2. Consequently, the HDD 10 according to this embodiment can be improved in terms of the durability of the fourth wire 84 against thermal stress. For example, the HDD 10 can avoid the fourth wire 84 from being damaged due to thermal stress, leading to reducing occurrence of a malfunction of the HDD 10.

The second mounted component 72 includes the second preamplifier 77 and the second underfill 78 that fixes the second preamplifier 77 to the FPC 22. That is, the second mount 64 corresponds to the part of the FPC 22 fixed to the second preamplifier 77 by the second underfill 78. The first preamplifier 75 and the second preamplifier 77 generate heat during the operation of the HDD 10. Thus, the heat is likely to cause thermal stress along the virtual line LV2 in the vicinity of the first mount 63 and the second mount 64 of the FPC 22. In this embodiment, however, the fourth wire 84 extends in the direction intersecting at the angle θ2 of larger than 45 degrees and not larger than 90 degrees with the extending direction of the virtual line LV2. Consequently, the HDD 10 according to this embodiment can be improved in terms of the durability of the fourth wire 84 against thermal stress.

Between the first attachment part 61 and the first mount 63, the width of the first wire 81 is set to 35 μm or less. Further, between the first mount 63 and the second mount 64, the width of the fourth wire 84 is set to 35 μm or less. Setting the first wire 81 and the fourth wire 84 to thinner widths as described above can facilitate the layout design of the conductor pattern 80 and the components on the FPC 22. Meanwhile, as the first wire 81 and the fourth wire 84 decrease in width, the first wire 81 and the fourth wire 84 become more vulnerable to thermal stress. However, in this embodiment, the first wire 81 extends in the direction intersecting at the angle θ1 of larger than 45 degrees and not larger than 90 degrees with the extending direction of the virtual line LV1. Because of this, the first wire 81 can improve in durability against thermal stress. Further, in this embodiment, the fourth wire 84 extends in the direction intersecting at the angle θ2 of larger than 45 degrees and not larger than 90 degrees with the extending direction of the virtual line LV2, thereby improving in durability against thermal stress.

The FPC 22 includes the first attachment part 61 fixed to the rotary actuator 49. The first underfill 76 fixes the first preamplifier 75 to the FPC 22. The conductor pattern 80 formed in the FPC 22 includes at least one of the first wire 81, the second wire 82, the third wire 83, the first via hole 91, and the second via hole 92. In the area AB1 between the first attachment part 61 and the first underfill 76, the first wire 81 extends in the direction intersecting at the angle θ1 of larger than 45 degrees and not larger than 90 degrees with the extending direction of the virtual line LV1 that connects the shortest distance between the first attachment part 61 and the first underfill 76 along the first surface 51. Consequently, the HDD 10 according to this embodiment can be improved in terms of the durability of the first wire 81 against thermal stress. The second wire 82 and the first via hole 91 are covered with the first underfill 76 in the second direction D2 intersecting with the first surface 51. In the FPC 22, the area AC2 covered with the first underfill 76 is held by the first underfill 76, which can work to reduce the thermal contraction and thermal expansion of the FPC. Consequently, the HDD 10 according to this embodiment can be improved in terms of the durability of the second wire 82 and the first via hole 91 against thermal stress. The third wire 83 and the second via hole 92 are covered with the first preamplifier 75 in the second direction D2. In the FPC 22, the area AC1 covered with the first preamplifier 75 is surrounded by the first underfill 76, which can work to reduce the thermal contraction and thermal expansion of the FPC. Consequently, the HDD 10 according to this embodiment can be improved in terms of the durability of the third wire 83 and the second via hole 92 against thermal stress.

The first underfill 76 fixes the first preamplifier 75 to the FPC 22. The second underfill 78 fixes the second preamplifier 77 to the FPC 22. The conductor pattern 80 formed in the FPC 22 includes at least one of the fourth wire 84, the fifth wire 85, the sixth wire 86, the third via hole 93, and the fourth via hole 94. In the area AB2 between the first underfill 76 and the second underfill 78, the fourth wire 84 extends in the direction intersecting at the angle θ2 of larger than 45 degrees and not larger than 90 degrees with the extending direction of the virtual line LV2 that connects the shortest distance between the first underfill 76 and the second underfill 78 along the first surface 51. Consequently, the HDD 10 according to this embodiment can be improved in terms of the durability of the fourth wire 84 against thermal stress. The fifth wire 85 and the third via hole 93 are covered with the first underfill 76 or the second underfill 78 in the second direction D2. In the FPC 22, the part covered with the underfill is held by the underfill, which can work to reduce the thermal contraction and thermal expansion of the FPC. Consequently, the HDD 10 according to this embodiment can be improved in terms of the durability of the fifth wire 85 and the third via hole 93 against thermal stress. The sixth wire 86 and the fourth via hole 94 are covered with the first preamplifier 75 or the second preamplifier 77 in the second direction D2. In the FPC 22, the part covered with the preamplifier is surrounded by the underfill, which work to reduce the thermal contraction and thermal expansion of the FPC. Consequently, the HDD 10 according to this embodiment can be improved in terms of the durability of the sixth wire 86 and the fourth via hole 94 against thermal stress.

For example, along with an increase in the capacity of the HDD 10, the number of magnetic heads 15 and the number of terminals for the magnetic heads 15 increase, and the number of pads 53 and the number of wires in the FPC 22 also increase. In addition, expanding the function of the first preamplifier 75 and the second preamplifier 77 leads to enlargement of their size. Due to these factors, for example, the first preamplifier 75 and the second preamplifier 77 may be placed near the first attachment part 61 and the second attachment part 62, as in this embodiment. Alternatively, the first preamplifier 75 and the second preamplifier 77 may be placed closer to each other. Various types of wiring extend from the first preamplifier 75 so that an increase in the number of wires results in limiting the wiring layout. For this reason, part of the wiring, such as the first wire 81, may pass through the area AB1 between the first attachment part 61 and the first mount 63 where thermal stress occurs. Another part of wiring, such as the fourth wire 84, may pass through the area AB2 between the first mount 63 and the second mount 64 where thermal stress occurs. In this embodiment, by setting the extending directions of the first and fourth wires 81 and 84 as above, the first and fourth wires 81 and 84 can improve in durability against thermal stress. Consequently, the HDD 10 according to this embodiment can be improved in terms of the durability of the first and fourth wires 81 and 84 against thermal stress without significantly changing the design of the HDD 10 such as the wiring layout.

The first to fourth via holes 91 to 94 are arranged near the first preamplifier 75 in order to allow the second, third, fifth, and sixth wires 82, 83, 85, and 86 to function as differential wires, for example. Typically, the connection between the via hole and the wiring is vulnerable to thermal stress. However, in this embodiment, the first and third via holes 91 and 93 are covered with the first underfill 76, and the second and fourth via hole 92 and 94 are covered with the first preamplifier 75, so that the durability of the first to fourth via holes 91 to 94 against thermal stress is improved. Consequently, the HDD 10 according to this embodiment can be improved in terms of the durability of the first to fourth via holes 91 to 94 against thermal stress without significantly changing the design of the HDD 10 such as the wiring layout.

According to at least one embodiment described above, the flexible printed circuit board includes a surface, a first fixed part fixed to a first component, and a second fixed part fixed to a second component. Wiring is installed on the flexible printed circuit board, extending along the surface, and extending between the first fixed part and the second fixed part in a direction intersecting at an angle of larger than 45 degrees and not larger than 90 degrees with an extending direction of a virtual line that connects the shortest distance between the first fixed part and the second fixed part along the surface. The thermal contraction and/or thermal expansion of the flexible printed circuit board, if it occurs, cause thermal stress in the extending direction of the virtual line between the first fixed part and the second fixed part. In this embodiment, the wiring extends in the direction intersecting at the angle of larger than 45 degrees and not larger than 90 degrees with the extending direction of the virtual line. This setting increases the cross-sectional area of the wiring orthogonal to the extending direction of the virtual line in comparison with the wiring extending in parallel to the virtual line. Consequently, the disk device according to this embodiment can be improved in terms of the durability of the wiring against thermal stress.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
   a recording medium of a disk form including a recording layer;
   a first magnetic head configured to read and write information from and to the recording medium;
   a first wiring member electrically connected to the first magnetic head;
   a flexible printed circuit board comprising a surface, a first fixed part fixed to a first component, and a second fixed part fixed to a second component, the flexible printed circuit board electrically connected to the first magnetic head through the first wiring member; and
   a wire installed on the flexible printed circuit board, extending along the surface, the wire extending between the first fixed part and the second fixed part in a direction intersecting at an angle of larger than 45 degrees and not larger than 90 degrees with an extending direction of a virtual line that connects a shortest distance between the first fixed part and the second fixed part along the surface.

2. The disk device according claim 1, wherein
   the first component comprises a rotary actuator configured to rotate to move the first magnetic head, and
   the second component comprises:
   a preamplifier mounted on the flexible printed circuit board, the preamplifier configured to output a write signal to the first magnetic head and receive a read signal from the first magnetic head through the flexible printed circuit board and the first wiring member, the write signal corresponding to information to be written by the first magnetic head to the recording medium, the read signal corresponding to information read by the first magnetic head from the recording medium, and
   an underfill that fixes the preamplifier to the flexible printed circuit board.

3. The disk device according to claim 2, wherein
   the flexible printed circuit board comprises a third fixed part fixed to the first component, and
   the second fixed part is located between the first fixed part and the third fixed part.

4. The disk device according to claim 1, further comprising:
   a second magnetic head configured to read and write information from and to the recording medium; and
   a second wiring member electrically connected to the second magnetic head and the flexible printed circuit board,
   wherein
   the first component comprises:
   a first preamplifier mounted on the flexible printed circuit board, the first preamplifier configured to output a write signal to the first magnetic head and receive a read signal from the first magnetic head through the flexible printed circuit board and the first wiring member, the write signal corresponding to information to be written by the first magnetic head to the recording medium, the read signal corresponding to information read by the first magnetic head from the recording medium, and
   a first underfill that fixes the first preamplifier to the flexible printed circuit board, and
   the second component comprises:
   a second preamplifier mounted on the flexible printed circuit board, the second preamplifier configured to output a write signal to the second magnetic head and receive a read signal from the second magnetic head through the flexible printed circuit board and the second wiring member, the write signal corresponding to information to be written by the second magnetic head to the recording medium, the read signal corresponding to information read by the second magnetic head from the recording medium, and
   a second underfill that fixes the second preamplifier to the flexible printed circuit board.

5. The disk device according to claim 1, wherein
   between the first fixed part and the second fixed part, the wire has a width of 35 µm or less.

6. A disk device comprising:
   a recording medium of a disk form including a recording layer;
   a first magnetic head configured to read and write information from and to the recording medium;

a rotary actuator configured to rotate to move the first magnetic head;

a first wiring member electrically connected to the first magnetic head;

a flexible printed circuit board comprising a surface and a fixed part fixed to the rotary actuator, the flexible printed circuit board electrically connected to the first magnetic head through the first wiring member;

a preamplifier mounted on the flexible printed circuit board, the preamplifier configured to output a write signal to the first magnetic head and receive a read signal from the first magnetic head through the flexible printed circuit board and the first wiring member, the write signal corresponding to information to be written by the first magnetic head to the recording medium, the read signal corresponding to information read by the first magnetic head from the recording medium;

an underfill that fixes the preamplifier to the flexible printed circuit board; and a conductor pattern formed in the flexible printed circuit board, the conductor pattern including at least one of:

a first wire that extends along the surface, and extends between the fixed part and the underfill in a direction intersecting at an angle of larger than 45 degrees and not larger than 90 degrees with an extending direction of a virtual line that connects a shortest distance between the fixed part and the underfill along the surface, a second wire that extends along the surface, and is covered with the underfill between the fixed part and the preamplifier in a direction intersecting with the surface, a third wire that extends along the surface, and is covered with the preamplifier between the fixed part and a geometric center of the preamplifier in a direction intersecting with the surface, a first via hole that is located between the fixed part and the preamplifier in the extending direction of the virtual line, and is covered with the underfill in a direction intersecting with the surface, and a second via hole that is located between the fixed part and the geometric center of the preamplifier in an extending direction of the virtual line, and is covered with the preamplifier in a direction intersecting with the surface.

7. A disk device comprising:

a recording medium of a disk form including a recording layer;

a first magnetic head configured to read and write information from and to the recording medium;

a first wiring member electrically connected to the first magnetic head;

a second magnetic head configured to read and write information from and to the recording medium;

a second wiring member electrically connected to the second magnetic head;

a flexible printed circuit board having a surface, the flexible printed circuit board electrically connected to the first magnetic head through the first wiring member and electrically connected to the second magnetic head through the second wiring member;

a first preamplifier mounted on the flexible printed circuit board, the first preamplifier configured to output a write signal to the first magnetic head and receive a read signal from the first magnetic head through the flexible printed circuit board and the first wiring member, the write signal corresponding to information to be written by the first magnetic head to the recording medium, the read signal corresponding to information read by the first magnetic head from the recording medium;

a first underfill that fixes the first preamplifier to the flexible printed circuit board;

a second preamplifier mounted on the flexible printed circuit board, the second preamplifier configured to output a write signal to the second magnetic head and receive a read signal from the second magnetic head through the flexible printed circuit board and the second wiring member, the write signal corresponding to information to be written by the second magnetic head to the recording medium, the read signal corresponding to information read by the second magnetic head from the recording medium;

a second underfill that fixes the second preamplifier to the flexible printed circuit board; and a conductor pattern formed in the flexible printed circuit board, the conductor pattern including at least one of:

a fourth wire that extends along the surface, and extends between the first underfill and the second underfill in a direction intersecting at an angle of larger than 45 degrees and not larger than 90 degrees with an extending direction of a virtual line that connects a shortest distance between the first underfill and the second underfill along the surface, a fifth wire that extends along the surface, and is covered with the first underfill or the second underfill between the first preamplifier and the second preamplifier in a direction intersecting with the surface, a sixth wire that extends along the surface, and is covered with the first preamplifier or the second preamplifier between a geometric center of the first preamplifier and a geometric center of the second preamplifier in a direction intersecting with the surface, a third via hole that is located between the first preamplifier and the second preamplifier in the extending direction of the virtual line, and is covered with the first underfill or the second underfill in a direction intersecting with the surface, and a fourth via hole that is located between the geometric center of the first preamplifier and the geometric center of the second preamplifier in the extending direction of the virtual line, and is covered with the first preamplifier or the second preamplifier in a direction intersecting with the surface.

* * * * *